United States Patent
Hieltscher

(10) Patent No.: US 10,833,676 B2
(45) Date of Patent: Nov. 10, 2020

(54) SWITCHING ELEMENT

(71) Applicant: BROSE FAHRZEUGTEILE GMBH & CO. KOMMANDITGESELLSCHAFT, Bamberg (DE)

(72) Inventor: Stefan Hieltscher, Bamberg (DE)

(73) Assignee: Brose Fahrzeugteile GmbH & Co. Kommanditgesellschaft, Bamberg, Bamberg (DE)

(*) Notice: Subject to any disclaimer, the term of this patent is extended or adjusted under 35 U.S.C. 154(b) by 4 days.

(21) Appl. No.: 16/253,527

(22) Filed: Jan. 22, 2019

(65) Prior Publication Data

US 2019/0158088 A1    May 23, 2019

Related U.S. Application Data

(63) Continuation of application No. PCT/EP2017/068303, filed on Jul. 20, 2017.

(30) Foreign Application Priority Data

Jul. 21, 2016  (DE) .......... 10 2016 213 378

(51) Int. Cl.
  *H03K 17/955*  (2006.01)
  *E05F 15/73*  (2015.01)
  *H03K 17/945*  (2006.01)

(52) U.S. Cl.
  CPC .......... *H03K 17/955* (2013.01); *E05F 15/73* (2015.01); *E05Y 2400/858* (2013.01);
  (Continued)

(58) Field of Classification Search
  CPC ........ H03K 17/00; H03K 17/955; E05F 15/73
  See application file for complete search history.

(56) References Cited

U.S. PATENT DOCUMENTS 9,463,776 B2  10/2016  Gunreben
9,787,306 B2  10/2017  Muzzetto
(Continued)

FOREIGN PATENT DOCUMENTS

DE    102010060364 A1    5/2012
DE    102014101775 A1    8/2014
(Continued)

OTHER PUBLICATIONS

International Search Report dated Oct. 10, 2017 in corresponding application PCT/EP2017/068303.
(Continued)

*Primary Examiner* — Eduardo Colon Santana
*Assistant Examiner* — Said Bouziane
(74) *Attorney, Agent, or Firm* — Muncy, Geissler, Olds & Lowe, P.C.

(57) ABSTRACT

A switching element for the contactless activation of an electric-motor adjustment drive of a motor vehicle, in particular an electric-motor-operated liftgate, having a profile strip, which extends in a longitudinal direction. The profile strip has a channel, which extends in the longitudinal direction and which transitions into a slit, which extends in the longitudinal direction. An electrode is arranged within the channel. The invention further relates to an electric-motor-operated liftgate having a switching element and to a method for creating a switching element.

12 Claims, 4 Drawing Sheets

(52) U.S. Cl.
CPC .................. *E05Y 2900/546* (2013.01); *H03K 2017/9455* (2013.01); *H03K 2217/96078* (2013.01)

(56) References Cited

U.S. PATENT DOCUMENTS

| | | | |
|---|---|---|---|
| 10,501,979 B2 | 12/2019 | Gunreben | |
| 2011/0128018 A1* | 6/2011 | Reime | .................. H03K 17/955 324/679 |
| 2016/0049932 A1* | 2/2016 | Muzzetto | ............. H03K 17/955 324/686 |
| 2018/0348015 A1 | 12/2018 | Takayanagi | |

FOREIGN PATENT DOCUMENTS

| | | |
|---|---|---|
| DE | 102014015899 A1 | 5/2015 |
| JP | 2015521129 | 7/2015 |
| JP | 2017173121 A | 9/2017 |
| JP | 2018204958 A | 12/2018 |

OTHER PUBLICATIONS

Wirthwein AG, 'Plastic Cable Ducts', Brochure 2014.
Japanese Office Action dated Nov. 22, 2019 in corresponding application 2019-502649.

\* cited by examiner

SWITCHING ELEMENT

This nonprovisional application is a continuation of International Application No. PCT/EP2017/068303, which was filed on Jul. 20, 2017, and which claims priority to German Patent Application No. 10 2016 213 378.0, which was filed in Germany on Jul. 21, 2016, and which are both herein incorporated by reference.

BACKGROUND OF THE INVENTION

Field of the Invention

The present invention relates to a switching element for the contactless activation of an electric-motor adjusting drive of a motor vehicle. In particular, a user input or request is detected during operation by means of the switching element. The electric-motor adjusting drive is suitably an electric-motor-operated tailgate. The invention further relates to an electric-motor-operated tailgate and a method for creating a contactless switching element.

Description of the Background Art

To increase convenience, motor vehicles increasingly have electrically operated adjusting drives. Thus, in particular a side sliding door of a motor vehicle and tailgates are operated by an electric motor. In other words, the sliding door or the tailgate is used as an adjusting part and upon activation of the adjusting drive it is brought into an open or closed position. Further, an approach of the user to the motor vehicle is usually monitored by near-field sensors, and the motor vehicle is unlocked when the user approaches it. To further increase convenience, in this case, the activation of the adjusting drive occurs by means of a contactless sensor that detects the user's movement. As a result, a manual operation of the adjusting drive is not necessary, so that the tailgate or sliding door can also be opened if the user cannot use his hands for this, for example, because he carries a load.

The switching element activating the adjusting drive in this case usually comprises a capacitive sensor with an electrode. The capacitive sensor is usually disposed in the region of a rear bumper of the motor vehicle, which is why a user's approach to the tailgate can be detected. Here, the switching element is mounted in a lower region of the vehicle body, so that a movement of a user's foot is detected as an activation signal. As a result, the switching element is exposed relatively unprotected to splashing water and to other weather conditions, which reduces the reliability of the switching element. Also, relatively many manufacturing steps are required to produce the switching element, because a wide variety of materials must be joined together, which thus increases manufacturing costs. Also, mounting on the motor vehicle is relatively time-consuming.

SUMMARY OF THE INVENTION

It is therefore an object of the present invention to provide a particularly suitable switching element for the contactless activation of an electric-motor adjusting drive of a motor vehicle, and a particularly suitable electric-motor-operated tailgate, and a particularly suitable method for producing a switching element, wherein production costs are expediently reduced and preferably reliability is increased.

The switching element can be used for the contactless activation of an electric-motor adjusting drive and is particularly suitable, provided, and/or set up for this purpose. The switching element is preferably a component of the electric-motor adjusting drive. The electric-motor adjusting drive has an electric motor and an adjusting part, which can be moved along the adjusting path by means of the electric motor. The adjusting part is, for example, a side door of a motor vehicle, for example, a sliding door. However, the adjusting part is particularly preferably a tailgate, and the electric-motor adjusting drive is thus an electric-motor-operated tailgate.

A user input or user request but at least a user action is detected by the switching element and an energization of the electric motor is changed as a function of this. In particular, the electric motor is activated as a function of the switching element. Consequently, no contact is required for the activation of the electric-motor adjusting drive. In particular, the electric-motor adjusting drive is activated if an approach of a user to a specific location is detected by the switching element, wherein the switching element itself is not touched. In this case, activation is understood in particular to mean a change in the energization and/or adjustment of the adjusting drive.

The switching element itself can have a profile strip extending in a longitudinal direction. In other words, the profile strip has the greatest extent in the longitudinal direction, and expediently the profile strip always has the same cross section perpendicular to the longitudinal direction or the same cross section over at least 80% of the extent, 90% of the extent, or 95% of the extent. The profile strip has a channel extending in the longitudinal direction, the extent of which in the longitudinal direction is expediently the same as the extent of the profile strip. In other words, the profile strip has the channel over its full extent in the longitudinal direction. The channel itself has, for example, a round or a rectangular, expediently a square or substantially square cross section. The channel transitions into a slot extending in the longitudinal direction, wherein the slot preferably has the same extent in the longitudinal direction as the channel. Expediently, the profile strip has the slot over the entire length in the longitudinal direction. Expediently, the profile strip is a hollow profile strip, and thus has, for example, a (closed) chamber, which further reduces weight. Expediently, the profile strip is made in one piece. This increases robustness and lowers manufacturing costs.

An electrode is disposed within the channel. In other words, in particular, the electrode, which can receive and forward signals, is introduced into the profile strip. The electrode comprises an electrically conductive element, which includes, for example, of copper or aluminum. The electrically conductive element is or is not electrically insulated, for example. The profile strip preferably is used as a geometric base and for fixing the electrode, which serves in particular as a sensor and/or antenna. The electrode is expediently a component of a near-field sensor and/or a capacitive sensor and is used to detect a user's approach to the switching element, wherein, for example, a distance between 1 m and 10 cm, between 20 cm and 50 cm, and, for example, a distance from substantially 30 cm+/−10 cm, 5 cm is detected. For example, the switching element comprises a control unit, by means of which the signals detected by the electrode are evaluated and analyzed. In particular, a change in a dielectric constant in the vicinity of the electrode is detected thereby. The electrode is connected to the control unit electrically/by means of signals, for example, by means of a line. Alternatively, the electrode is directly connected to a circuit board of the control unit and in particular held on it. Suitably, the electrode is soldered to the circuit board or connected by press-fit contacts. Expediently, the switching element is formed of the electrode and the profile strip.

The switching element therefore has a relatively small number of components, which is why manufacturing costs are reduced. Assembly is also simplified because the electrode can be inserted into the channel by means of the slot over substantially the entire length of the channel, rather than having to be threaded longitudinally into the channel, for example. It is also possible to make the profile strip relatively robust, so that damage to the profile strip, in particular in the region of the slot, can be substantially ruled out when the electrode is mounted in the channel.

The electrode can have an electrically conductive core, which extends in the longitudinal direction and by means of which, in particular, the functioning of the electrode is provided. To protect the electrically conductive core, it is preferably provided peripherally with electrical insulation. The core is thus surrounded on its outer surface with electrical insulation, wherein the boundary is determined in a direction perpendicular to the longitudinal direction. In other words, the outer circumference of the core is always surrounded by electrical insulation in a cross section perpendicular to the longitudinal direction. Expediently, the electrical insulation forms the peripheral boundary of the electrode. Consequently, a wire can be used as the electrode, which further reduces manufacturing costs.

The electrical insulation can be formed of, for example, a plastic. The core is in particular made in one piece or formed, for example, by means of a number of different strands. The core cross section is, for example, round or angular. In other words, the electrically conductive core is a flat conductor. Alternatively, the core is a wire, a strand, or a bundle of wires or strands. Expediently, the electrode is manufactured in one step, which is independent of the profile strip fabrication. In other words, the electrode and the profile strip are two separate components that are mounted together to create the switching element. For example, the electrode is made of an enameled wire, such as copper enameled wire, or is formed of the enameled wire.

For example, the extent of the slot perpendicular to the longitudinal direction is equal to the extent of the channel perpendicular to the longitudinal direction. In other words, the slot is flush with the channel on both sides. In this case, the channel expediently has a rectangular or square cross section perpendicular to the longitudinal direction. One of the boundary sides of the channel is thus broken away by the slot, which is why the composite of slot and channel has a substantially U-shaped cross section perpendicular to the longitudinal direction. Particularly preferably, however, the extent of the slot perpendicular to the longitudinal direction is smaller than the extent of the channel perpendicular to the longitudinal direction. For example, the extent of the slot is less than 50%, 30%, 20%, or 10% of the extent of the channel. Alternatively or particularly preferably in combination hereto, the extent of the slot perpendicular to the longitudinal direction is smaller than the extent of the electrode perpendicular to the longitudinal direction. For example, the extent of the slot is less than 50%, 40%, 30%, 20%, or 10% of the extent of the electrode.

For mounting the electrode within the channel, the slot is preferably widened, in particular elastically, and the electrode is inserted into the channel through the widened slot. Following this, the slot is again reduced in size, which occurs independently, for example, due to the elasticity. Alternatively, the slot is again reduced manually or by means of a tool during assembly. As a result, the electrode is relatively effectively protected against mechanical influences, wherein assembly is simplified. In summary, an undercut is provided by means of the slot, which in the assembled state expediently holds the electrode within the channel.

For example, the slot opens centrally in the channel. In other words, the channel extends perpendicular to the longitudinal direction on both sides of the slot. Alternatively, the slot is offset relative to the center and is preferably placed at an edge of the channel. Expediently, the channel has a substantially square or rectangular cross section perpendicular to the longitudinal direction and one of the corners is formed in particular by the slot. In other words, the channel is made substantially cuboid and the slot forms one of the channel edges. In this way, detachment of the electrode out of the channel is relatively effectively prevented, wherein assembly is facilitated because the boundary surface of the channel adjacent to the slot can be pivoted by a relatively large amount for assembly.

Preferably, the profile strip is designed flat and has two narrow sides, extending in the longitudinal direction, and a top side, extending in the longitudinal side, and a bottom side, extending along the longitudinal side. The extent of the top side perpendicular to the longitudinal direction in this case is greater than the extent of the narrow sides perpendicular to the longitudinal direction. The extent of the bottom side perpendicular to the longitudinal direction is greater than the extent of the narrow side perpendicular to the longitudinal direction. Expediently, the extent of the top side/bottom side perpendicular to the longitudinal direction is greater than twice, three times, four times, or ten times the extent of the narrow sides perpendicular to the longitudinal direction. For example, the extent of the two narrow sides perpendicular to the longitudinal direction is substantially equal. Alternatively or in combination therewith, the extent of the top side perpendicular to the longitudinal direction is equal to the extent of the bottom side perpendicular to the longitudinal direction. Preferably, the profile strip is made substantially cuboid. In this way, mounting on the motor vehicle is simplified. Also, production and storage of the profile strip are simplified.

Expediently, the top side has the slot. In other words, for assembly the electrode is inserted from the top side of the profile strip into the channel. Expediently, the profile strip is made flexible. Due to the enlarged extent of the top side perpendicular to the longitudinal direction, assembly is simplified in this way, provided that the profile strip is made flexible. The profile strip can also be maintained relatively stably during assembly in this way. Alternatively or in combination herewith, the bottom side has a fastener for mounting on a body of the motor vehicle. In particular, the fastening element is provided for the reversible or irreversible attachment of the profile strip to the body. The fastener is, for example, an adhesive strip. Alternatively, the fastener is made such that an adhesive is incorporated by means of which the profile strip is glued to the body. For example, the fastener is provided by means of ribs for interconnection with the adhesive. In other words, the profile strip is glued to the body. In an alternative, the fastener is a clip or a latching element, so that the profile strip is clipped or latched to the body for mounting. In summary, for mounting the switching element is connected to the body by the fastener. Preferably, the profile strip comprises the fastener on the bottom side and the slot on the top side. In this way, the electrode can be mounted on the profile strip, if the latter is already attached to the body. Also, replacement of the electrode is possible, if it is damaged.

The profile strip can have an elongated hole extending in the longitudinal direction. The elongated hole is used for mounting on the body of the motor vehicle and is therefore provided and set up for this purpose. For mounting, a screw, a bolt, or a clip is passed through the elongated hole, wherein a head of the screw/bolt/clip is inserted in the profile strip. The end of the screw/bolt/clip projecting through the elongated hole is fastened to the body for mounting. Due to the design of an elongated slot, tolerance compensation is possible during mounting, which simplifies the mounting.

The profile strip can comprise a second channel, which also extends in the longitudinal direction and which transitions into a second slot extending in the longitudinal direction. The second channel is preferably structurally identical to the channel and in particular spaced therefrom, wherein the distance is, for example, between 1 mm and 10 mm, 2 mm, and 5 mm and in particular is equal to 3 mm. The slot is preferably structurally identical to the second slot. Manufacture of the profile strip is simplified in this way. The electrode is bent in a U-shape fashion and lies within the second channel. In other words, the electrode lies in both the channel and the second channel. The U-shaped end expediently projects over the profile strip, so that a one-piece electrode can be used, which is bent suitable for assembly. Expediently, the electrode is made in this case in the manner of a wire and/or the electrode is made of a bulk product. For fabrication, the electrode is expediently suitably bent and first introduced into the channel. Following this, the electrode is curved in the region of the exit from the profile strip and inserted into the second channel. In other words, the electrode is made loop-shaped. In this way, an enlarged monitoring range is provided by means of the electrode and susceptibility to interference due to electromagnetic interference fields is reduced.

The profile strip can have a third channel, which extends in the longitudinal direction and which transitions into a third slot extending in the longitudinal direction, and within which a second electrode is disposed. The third channel is preferably structurally identical to the channel or to the second channel, and/or the third slot is preferably structurally identical to the slot or second slot, which simplifies manufacture. The second electrode is in particular structurally identical to the electrode. In other words, the switching element has two electrodes, which is why a movement direction of a user's movement can also be detected. In this way, different functions of the electric-motor adjusting drive can be activated by the switching element. For example, the profile strip comprises a fourth channel, within which the second electrode also lies, which is expediently bent in a U-shaped fashion. In other words, the profile strip preferably has four channels of this type, each of which transitions into the respectively associated slot. In a further alternative, the profile strip comprises up to eight channels of this type, and, for example, one electrode lies in each case in four channels. Alternatively thereto, in each case an electrode is associated with two of the channels, so that the profile strip has four electrodes. In a further alternative, there are four channels of this kind, wherein only the electrode is disposed in all the channels and thus preferably comprises three U-shaped bends.

The profile strip can be made of, for example, a plastic or a rubber. In this way, a relatively inexpensive production of the switching element is possible. Also, the electrode is relatively safely protected due to the profile strip. Expediently, the plastic and/or rubber are designed as bendable, flexible, and/or elastic. In this way, the slot can be made relatively small and introduction of the electrode into the channel is still possible. An attachment of the profile strip to the curved body part of the motor vehicle is also possible. For assembly, the slot is preferably widened and the electrode is introduced into the channel, wherein this is expediently carried out by means of a tool, which is manufactured in particular in the manner of window piping (windshield piping). The tool has a substantially trapezoidal section, the wider end of which is located within the channel and the narrower end of which is outside the channel. The electrode passes through the trapezoid, so that upon movement of the tool in the longitudinal direction, the electrode is inserted into the channel.

The profile strip can be made in an injection molding or extrusion process. In this way, a wide variety of geometries and configurations of the channel and the associated slot are possible. Thus, a relatively simple fabrication of an undercut provided by the slot is made possible. Preferably, the profile strip is produced as a bulk product and then cut to the desired length, sawed or cut off, for example. A number of profile strips can be produced from the bulk product, which further reduces manufacturing costs.

The switching element can be used as or is a near-field sensor. Suitably, the switching element is used to activate the electric-motor adjusting drive, wherein the actuation of the switching element takes place without contact. Activation is understood in particular to mean the beginning of an adjusting movement of the adjusting part and/or the execution of an adjusting movement. The adjusting part is preferably brought into an open or closed position by means of the adjusting movement.

The electric-motor-operated tailgate comprises a switching element for the contactless activation. The switching element has a profile strip extending in a longitudinal direction, which comprises a channel extending in the longitudinal direction, which transitions into a slot extending in the longitudinal direction, wherein an electrode is disposed within the channel. For example, the electric-motor-operated tailgate comprises a control unit which is coupled electrically and/or by signals to the electrode. Sensor signals of the electrode are detected and processed by the control unit. In particular, a near-field sensor and/or a capacitive sensor are provided by means of the control unit and the electrode. Suitably, a provision/generation of a control signal for the electric motor takes place by means of the control unit, wherein the control signal is set depending on the sensor signal, which is determined by the electrode. In particular, the electric motor is energized by means of the control unit.

The method for producing a switching element provides that in a first step, a profile strip is made from a plastic or a rubber in an injection molding or extrusion process. The plastic or rubber is pressed in particular by a template in the longitudinal direction, wherein the template has a section by means of which a channel and a slot are created. Consequently, the profile strip has a channel which extends in the longitudinal direction and transitions into a slot extending in the longitudinal direction.

In a further step, an electrode is inserted through the slot into the channel and preferably fastened there. The insertion takes place in particular by hand or by means of a robot. To insert the electrode into the slot, a tool is used by means of which expediently the slot is widened elastically and, in particular, the electrode is inserted into the channel in the same step. In a further step, for example, a fastener is attached to the profile strip; for example, an adhesive strip is applied. In an alternative hereto, the connection of the fastening element is carried out when the profile strip is produced in the extrusion process. In a further alternative hereto, following the extrusion process, a number of elongated holes, but at least one elongated hole, are introduced, for example, punched or drilled, into the profile strip. In a subsequent step, the switching element is mounted on a body of the motor vehicle, such as a bumper. For this purpose, in particular the fastening element is used and/or the profile strip is advantageously glued to the body part.

Particularly preferably, the profile strip can be cut to a certain length prior to mounting on the motor vehicle. The length is in this case adapted in particular to the motor vehicle and is expediently between 30 cm and 1.50 m, 50 cm and 1 m, wherein the length denotes the extent in the longitudinal direction. In particular, the profile strip is produced in the extrusion process with a length greater than 1 m, 2 m, or 3 m, which reduces manufacturing costs. In other words, the profile strip is a bulk product. The cutting to length is done, for example, before the electrode has been inserted into the slot. In other words, the electrode is inserted into the cut profile strip. In an alternative hereto, the electrode is first introduced into the bulk product and subsequently cut to length, which further reduces production time.

The statements, embodiments, and advantages made/mentioned with regard to the contactless switching element are to be transferred analogously to the electric-motor-operated tailgate and to the method for producing a contactless switching element and vice versa.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
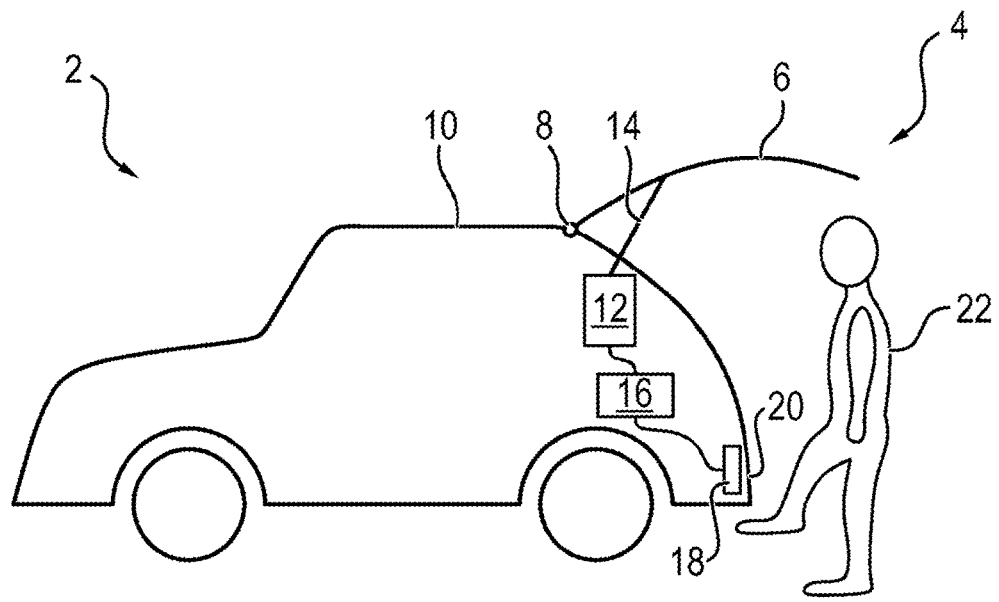
FIG. 1 shows schematically simplified an electric-motor-operated tailgate with a switching element.

FIG. 1 shows schematically simplified a motor vehicle 2 with an electric-motor-operated tailgate 4, which is thus an electric-motor adjusting drive. The electric-motor-operated tailgate 4 has a hatch door 6, which is mounted by means of a hinge 8 pivotally on a body 10 of motor vehicle 2. The electric-motor-operated tailgate 4 further comprises an electric motor 12 which is also fastened to body 10. An adjustable-length adjusting part 14 is driven by electric motor 12, which is fastened on one side to hatch door 6 and on the other side to body 10. Consequently, by operation of electric motor 12, hatch door 6 can be pivoted from an open to a closed position and from a closed to an open position. Electric motor 12 is controlled by a control unit 16, which is connected electrically and by signals to electric motor 12. In this case, the energization of electric motor 12 is set by control unit 16.

Further, electric-motor-operated tailgate 4 comprises a switching element 18 which is fastened to the inside of a rear bumper 20 of body 10. Switching element 18 is coupled by signals to control unit 16 and operates on a capacitive principle. If a user 22 moves his foot in the area of bumper 20, wherein the foot remains away from body 10, this is detected by switching element 18 due to a change in the dielectric constant in the vicinity of bumper 20. This sensor signal is evaluated by control unit 16 and interpreted as a user input or user request. Following this, electric motor 12 is energized, so that hatch door 6 is pivoted. In other words, switching element 18 is used for the contactless activation of electric-motor-operated tailgate 4.

Figure 2:
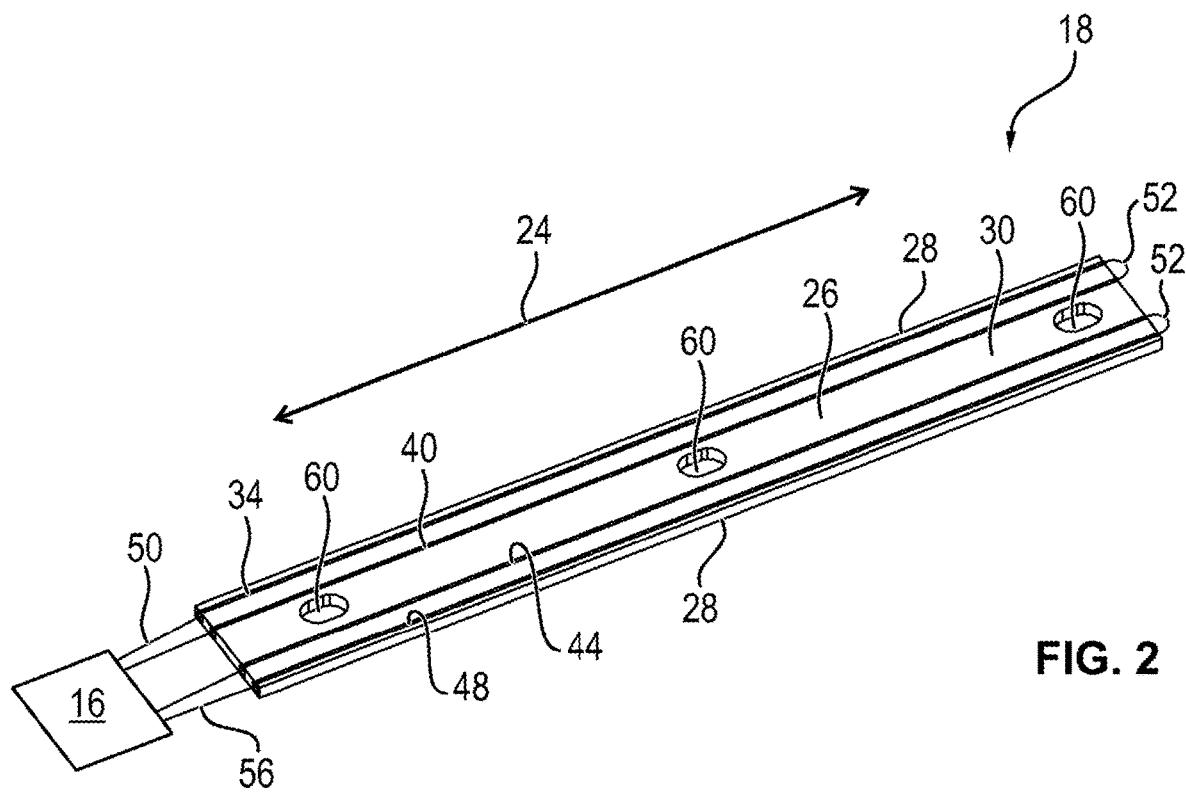
FIG. 2 perspectively shows the switching element.
Figure 3:
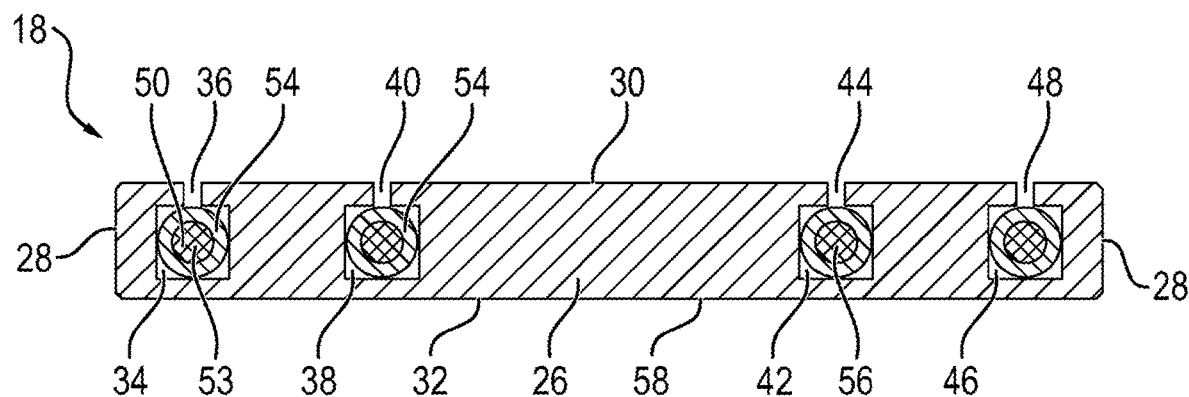
FIG. 3 shows the switching element in a sectional view.

In FIG. 2, switching element 18 is shown perspectively and in FIG. 3 in a sectional view perpendicular to a longitudinal direction 24. Switching element 18 comprises a profile strip 26, which is made of a plastic or a rubber in an extrusion process. Profile strip 26 has a substantially cuboidal cross section with two narrow sides 28 which extend in longitudinal direction 24 and whose extent is 2 mm perpendicular to longitudinal direction 24. Further, profile strip 26 comprises a top side 30 and a bottom side 32 which extend in the longitudinal direction 24 and whose extent is equal to 26 mm perpendicular to longitudinal direction 24. Consequently, profile strip 26 is designed flat.

Profile strip 26 further has a channel 34 whose cross section perpendicular to longitudinal direction 24 is square with an edge length of 2 mm. Channel 34 runs in longitudinal direction 24 and extends over the entire length of profile strip 26 in longitudinal direction 24. The channel transitions into a slot 36 which extends in longitudinal direction 24 and has top side 30. The extent of the slot perpendicular to longitudinal direction 24 is 0.5 mm, so that the extent of slot 36 perpendicular to longitudinal direction 24 is smaller than the extent of channel 34 perpendicular to longitudinal direction 24. Slot 36 is located substantially in the center of an edge of the substantially square cross section of channel 24, said edge facing top surface 30. Channel 34 is spaced by substantially 1 mm from one of the narrow sides 28.

Profile strip 26 further has a second channel 38 which extends in longitudinal direction 24 and transitions into a second slot 40 extending in longitudinal direction 24. Second channel 38 is structurally identical to channel 34, and second slot 40 and its placement with respect to second channel 38 correspond to slot 36 and its placement with respect to channel 34. The distance between second channel 38 and channel 34 is 3 mm.

Furthermore, profile strip 26 comprises a third channel 42, which extends in longitudinal direction 24 and transitions into a third slot 44 extending in longitudinal direction 24, and a fourth channel 46, which extends in longitudinal direction 24 and transitions into a fourth slot 48 extending in longitudinal direction 24. Third channel 42, third slot 44, as well as fourth channel 46 and fourth slot 48 are structurally identical to channel 34 and to slot 36 and their respective arrangement. The distance between third channel 42 and fourth channel 46 is 3 mm, and fourth channel 46 is 1 mm away from the narrow side 28 farthest from channel 34. Consequently, the arrangement of third channel 42 and third slot 44 as well as fourth channel 46 and fourth slot 48 corresponds to the arrangement of channel 34 and slot 36 as well as second channel 38 and second slot 40, but these are associated with different narrow sides 28.

An electrode 50, which has a substantially circular cross section and whose diameter corresponds to 2 mm, is disposed within channel 34 and second channel 38. Consequently, the extent of slot 36 perpendicular to longitudinal direction 24 is smaller than the extent of electrode 50. At one of the ends of profile strip 26, electrode 50 exits from profile strip 26 and has a U-shaped bend 52, so that the electrode is run from channel 34 to second channel 38. At the opposite end, electrode 50 also exits from profile strip 24 and is contacted there electrically with control unit 16. For this purpose, electrode 50 is fastened directly to a circuit board of control unit 16 and is electrically contacted with it, for example, by soldering or press-fit contacts. Alternatively, electrode 50 is electrically contacted with control unit 16 by means of a further line. Electrode 50 has, with the exception of bend 52, an electrically conductive core 53 extending in longitudinal direction 24 and is formed of a copper. Core 53 is circumferentially surrounded by an electrical insulation 54, which consequently surrounds core 53 in a jacket-like fashion. Thus, a wire can be used as electrode 52, which reduces manufacturing costs. A second electrode 56, which is structurally identical to electrode 50 and consequently also has bend 52, is disposed in third channel 42 and fourth channel 46. Further, second electrode 56 is also electrically contacted with control unit 16.

To attach profile strip 26 to bumper 20, bottom side 32 has an adhesive strip 58, so that profile strip 24 in the assembled state is glued to bumper 20. Further, profile strip 26 has three elongated holes 60 which extend in longitudinal direction 24 and are located in the region between second and third channel 38, 42. In the assembled state, clips or screws are arranged within elongated holes 60.

Figure 4:
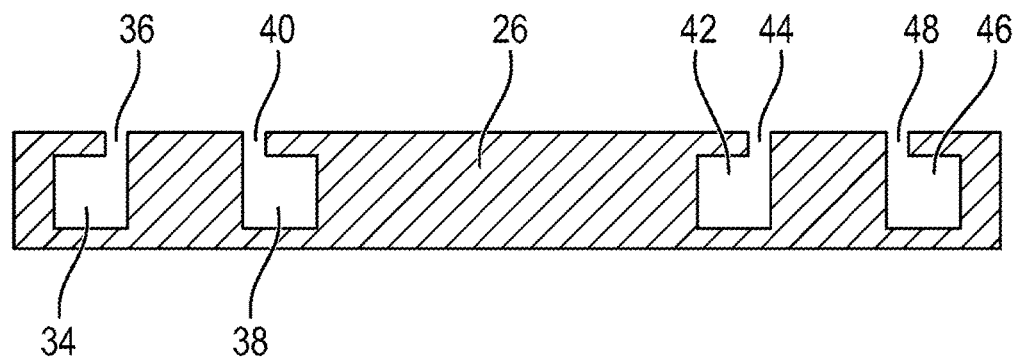
FIGS. 4 to 8 show exemplary embodiments of the switching element of FIG. 3.

A variation of profile strip 26 is shown in FIG. 4, which substantially corresponds to the previous embodiment. Only slot 36, second slot 40, third slot 44, and fourth slot 48 are modified, but continue to extend in longitudinal direction 24. Channel 34, second channel 38, third channel 42, and fourth channel 46, however, are not changed. Slots 36, 40, 44, 48 are now arranged such that they are arranged on the edge of the respective channel 34, 38, 42, 46 and thus substantially form an edge of cuboid channels 34, 38, 42, 48. Here, the distance between slot 36 and second slot 40 is equal to 3 mm and between third slot 44 and fourth slot 48 is also equal to 3 mm.

Figure 5:
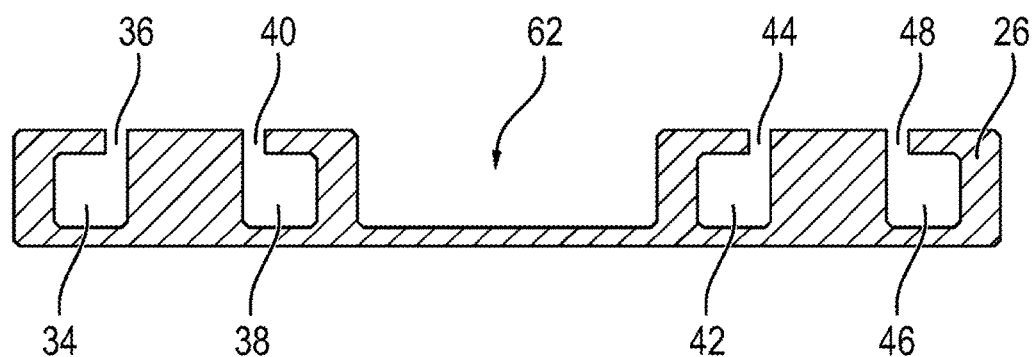

A further embodiment of profile strip 26 is shown in FIG. 5. In comparison with the previous embodiment, profile strip 26 between second channel 38 and third channel 42 has an cuboid open recess 62, extending in longitudinal direction 24, which reduces the weight of profile strip 26 and increases its flexibility.

Figure 6:
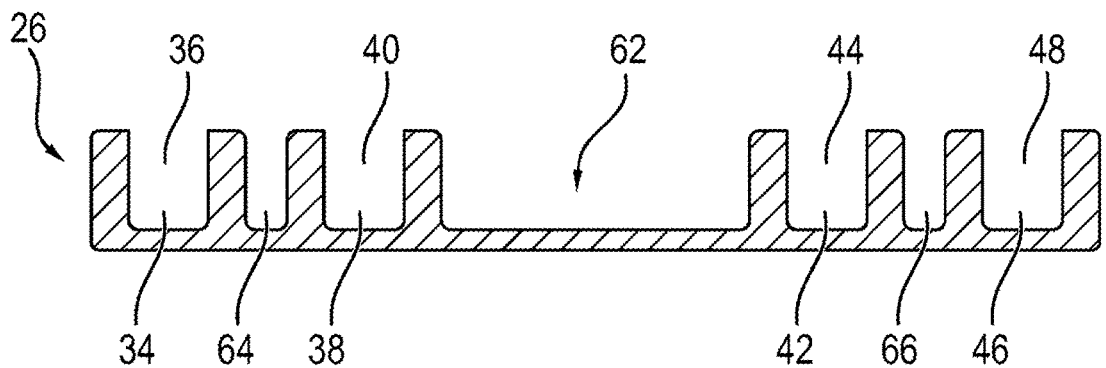

A further embodiment of profile strip 26 is shown in FIG. 6, wherein here as well channels 34, 38, 42, 46 are left unchanged. The open recess 62 is also present. In contrast to the previous embodiment, however, slots 36, 40, 44, 48 are widened and each has an extent, perpendicular to the longitudinal direction 24, of 2 mm. Consequently, slots 36, 40, 44, 48 are flush with the respective channel 34, 38, 42, 46 and thus do not constitute an undercut. An open second recess 64 is present centrally between channel 34 and second channel 38, and an open third recess 66 is present between third channel 42 and fourth channel 46, so that profile strip 26 has a substantially comb-shaped cross section perpendicular to longitudinal direction 24. As a result, profile strip 26 has a relatively low weight and increased flexibility.

Figure 7:
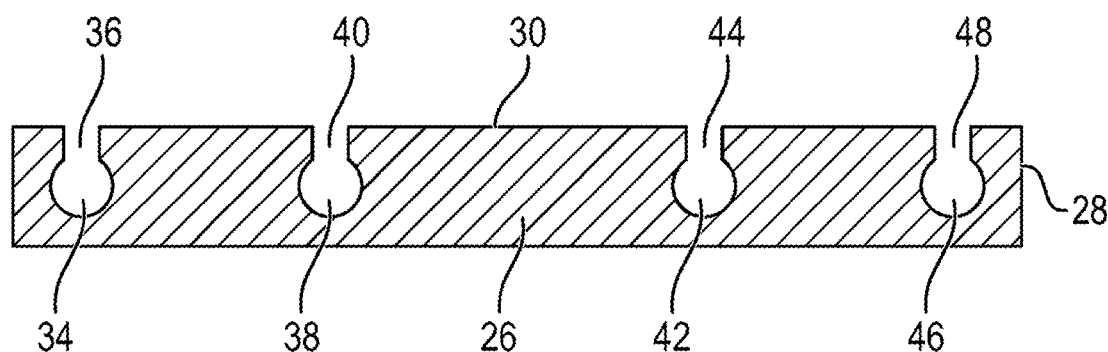
Figure 8:
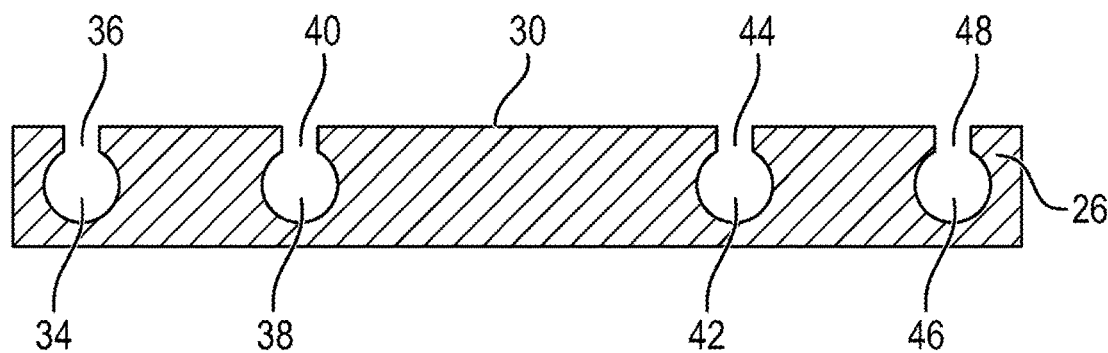

Two further embodiments of profile strip 26, which are a variation of the embodiment shown in FIG. 3, are shown in FIGS. 7 and 8. The cross section of channel 34, second channel 38, third channel 42, and fourth channel 46 is changed and circular. The cross section of all channels 34, 38, 42, 46 is the same. The diameter in the embodiment shown in FIG. 7 is between 1.5 mm and 2.0 mm and in the embodiment shown in FIG. 8 between 2.0 mm and 3.0 mm. Slot 36, second slot 40, third slot 44, and fourth slot 48 are unchanged, as well as their position with regard to the respective channel 34, 38, 42, 46.

Figure 9:
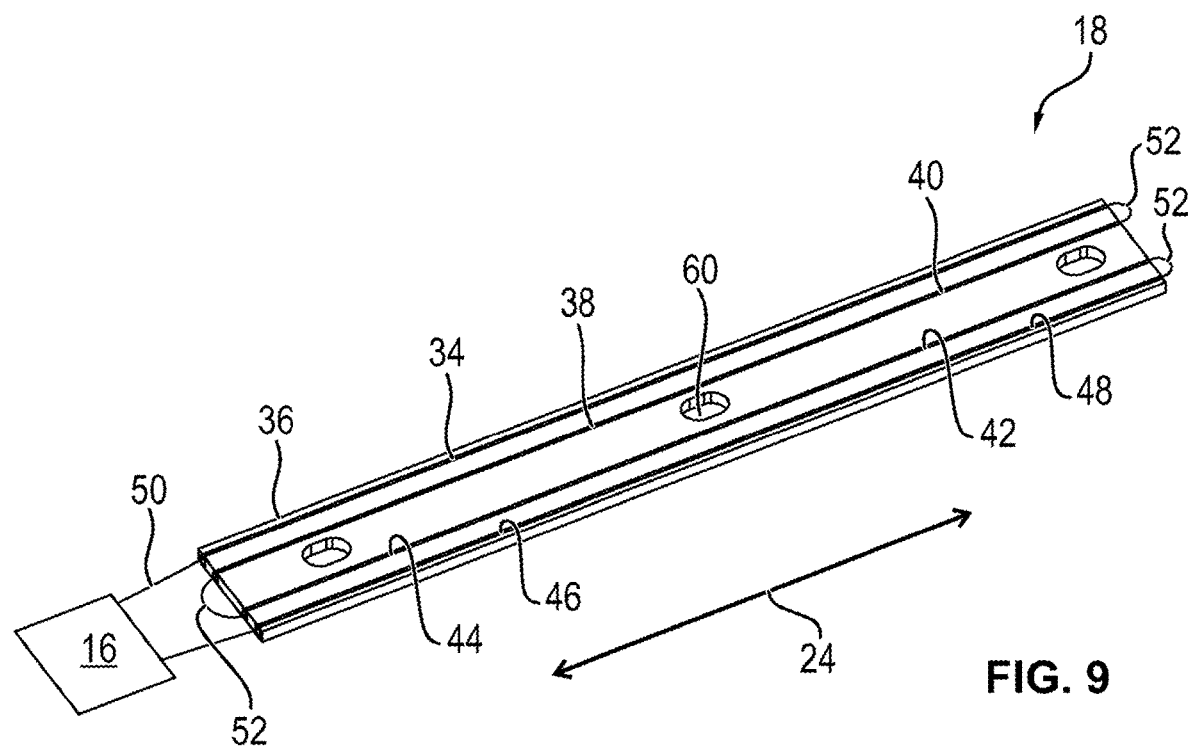
FIG. 9 shows an exemplary embodiment of the switching element of FIG. 2.

A further embodiment of switching element 18 according to FIG. 2 is shown in FIG. 9, wherein profile strip 26 is left unchanged. Second electrode 56 is omitted, and electrode 50 having three bends 52 lies in channel 34, second channel 38, third channel 42, and fourth channel 46. The ends of electrode 50 emerging from channel 34 and fourth channel 46 are electrically contacted with control unit 16.

Figure 10:
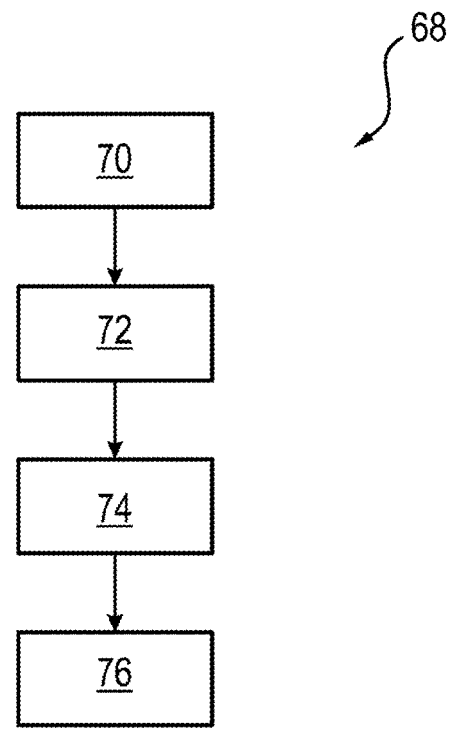
FIG. 10 shows a method for producing the switching element.

A method 68 for producing switching element 18 is shown in FIG. 10. In a first step 70, profile strip 26 is produced from a plastic or a rubber by means of an extrusion process. Here, a template for producing profile strip 26 is used, which has appropriate areas for channels 34, 38, 42, 46 and slots 36, 40, 44, 48 and, depending on the configuration, for recesses 62 or 64 and 66. The plastic or rubber is pressed in longitudinal direction 24 through the template. In a subsequent second step 72, profile strip 26, which has a length of, for example, 2 m or 3 m after the extrusion process and is therefore a bulk product, is cut to the length shown in FIG. 2, so that it is 50 cm long. In other words, four separate profile strips 26 are created from the bulk product.

In a subsequent third step 74, electrode 50 and second electrode 56 are provided. These have substantially twice the length of profile strip 26 in longitudinal direction 24 plus 20 cm+/−5 cm. In a subsequent fourth step 76, electrode 50 is inserted into channel 34 and second channel 38, and second electrode 56 is inserted into third channel 42 and fourth channel 46. For this purpose, so-called windshield or window piping is used, which has a substantially trapezoidal opening. The widened end is moved longitudinally within the respective channel 34, 38, 42, 46, wherein the respective electrode 50, 56 is arranged within the trapezoid. By moving the piping along the respective channel 34, 38, 42, 46, the associated slot 36, 40, 44, 48 is widened and thus electrode 50, 56 is positioned in the respective channel 34, 38, 42, 46.

In summary, electrode 50 is inserted into the extruded profile strip 26, wherein electrode 50 has the electrically conductive core 53 and electrical insulation 54 and expediently formed of these. In particular, an undercut is formed by means of slots 36, 40, 44, 48 and the portion of profile strip 26 covering the respective channel 34, 38, 42, 46 fixes the electrode 50, 56 within the respective channel. A sensor surface of the switching element 18 is determined by channels 34, 38, 42, 46.

In other words, the assembly principle of electrode 50, 56 essentially corresponds to that of a windshield piping, wherein the assembly takes place, for example, by hand, by means of an assembly aid, or by means of a robot. Profile strip 26 is produced as a bulk product and cut to respective length depending on the design. Further, the mounting of switching element 18 occurs by means of adhesive, wherein, for example, adhesive tape or an applied adhesive is used. Alternatively, clips are inserted into the integrated elongated holes 60. Because relatively few steps are required for assembly, costs are reduced. Lifetime is also increased because no sealing points need to be created. A relatively low weight of switching element 18 is realized as well.

The invention is not limited to the exemplary embodiments described above. Rather, other variants of the invention can also be derived herefrom by the skilled artisan, without going beyond the subject of the invention. Particularly, further all individual features described in relation to the individual exemplary embodiments can also be combined with one another in a different manner, without going beyond the subject of the invention.

The invention being thus described, it will be obvious that the same may be varied in many ways. Such variations are not to be regarded as a departure from the spirit and scope of the invention, and all such modifications as would be obvious to one skilled in the art are to be included within the scope of the following claims:

What is claimed is:

1. A switching element for a contactless activation of an electric-motor adjusting drive of a motor vehicle, the switching element comprising:
   a profile strip that extends in a longitudinal direction;
   a channel formed in the profile strip that extends in the longitudinal direction and transitions into a slot extending in the longitudinal direction; and
   an electrode arranged in the channel,
   wherein the profile strip has a rectangular cross-section with two flat narrow sides extending in the longitudinal direction and two flat wide sides extending in the longitudinal direction, the two flat wide sides including a flat top side and a flat bottom side, and
   wherein the slot is an opening that is recessed through the top side of the profile strip and that transitions into the channel, such that the channel is embedded inside the profile strip between the top side and the bottom side.

2. The switching element according to claim 1, wherein the electrode comprises an electrically conductive core that extends in the longitudinal direction and that is provided on a periphery with electrical insulation.

3. The switching element according to claim 1, wherein an extent of the slot substantially perpendicular to the longitudinal direction is smaller than an extent of the channel and/or of the electrode, and/or wherein the slot is placed at an edge of the channel.

4. The switching element according to claim 1, wherein the bottom side has a fastener for mounting on a body of the motor vehicle.

5. The switching element according to claim 1, wherein the profile strip has an elongated hole extending in the longitudinal direction for mounting on a body of the motor vehicle.

6. The switching element according to claim 1, wherein the profile strip has a second channel that extends in the longitudinal direction and that transitions into a second slot extending in the longitudinal direction, and wherein the electrode is bent in a U-shape fashion and lies within the second channel.

7. The switching element according to claim 6, wherein the profile strip has a third channel that extends in the longitudinal direction and that transitions into a third slot extending in the longitudinal direction and within which a second electrode is disposed.

8. The switching element according to claim 7, wherein the second slot is an opening that is recessed through the top side of the profile strip and that transitions into the second channel, such that the second channel is embedded inside the profile strip between the top side and the bottom side, and wherein the third slot is an opening that is recessed through the top side of the profile strip and that transitions into the third channel, such that the third channel is embedded inside the profile strip between the top side and the bottom side.

9. The switching element according to claim 1, wherein the profile strip is made of a plastic or a rubber in an extrusion process.

10. An electric-motor-operated tailgate comprising a switching element according to claim 1.

11. A method for producing a switching element according to claim 1, wherein
   the profile strip having the channel, which extends in the longitudinal direction and which transitions into the slot extending in the longitudinal direction, is made of a plastic or a rubber in an injection molding or extrusion process, the slot being formed as the opening that is recessed through the top side of the profile strip and that transitions into the channel, such that the channel is formed to be embedded inside the profile strip between the top side and the bottom side; and
   the electrode is inserted through the slot into the channel.

12. The method according to claim 11, wherein the profile strip is cut to a specific length.

* * * * *